(12) United States Patent
Briere et al.

(10) Patent No.: US 7,419,377 B1
(45) Date of Patent: Sep. 2, 2008

(54) ELECTRICAL COUPLING DEVICE AND METHOD FOR SOLAR CELLS

(75) Inventors: Rick Briere, Santa Clara, CA (US); Alelie Funcell, Fremont, CA (US)

(73) Assignee: Solaria Corporation, Fremont, CA (US)

( * ) Notice: Subject to any disclaimer, the term of this patent is extended or adjusted under 35 U.S.C. 154(b) by 0 days.

(21) Appl. No.: 11/841,899

(22) Filed: Aug. 20, 2007

(51) Int. Cl.
*H01R 41/00* (2006.01)
(52) U.S. Cl. ......................................... 439/32; 439/507
(58) Field of Classification Search ................... 439/32, 439/627, 507, 65
See application file for complete search history.

(56) References Cited

U.S. PATENT DOCUMENTS

| | | | | |
|---|---|---|---|---|
| 2,470,618 A | * | 5/1949 | Holden | 439/65 |
| 3,330,700 A | * | 7/1967 | Sequeira et al. | 136/244 |
| 3,446,676 A | * | 5/1969 | Goldsmith et al. | 136/244 |
| 3,575,721 A | * | 4/1971 | Mann | 136/244 |
| 3,700,714 A | | 10/1972 | Hamilton et al. | |
| 3,819,417 A | * | 6/1974 | Haynos | 136/244 |
| 3,993,505 A | * | 11/1976 | Pack, Sr. | 136/244 |
| 4,029,519 A | | 6/1977 | Schertz et al. | |
| 4,097,308 A | | 6/1978 | Klein et al. | |
| 4,118,249 A | | 10/1978 | Graven et al. | |
| 4,170,507 A | | 10/1979 | Keeling et al. | |
| 4,193,820 A | * | 3/1980 | Thomas | 136/244 |
| 4,203,646 A | * | 5/1980 | Desso et al. | 439/724 |
| 4,257,821 A | * | 3/1981 | Kelly et al. | 136/244 |
| 4,291,191 A | | 9/1981 | Dahlberg | |
| 4,362,903 A | * | 12/1982 | Eichelberger et al. | 174/94 R |
| 4,668,314 A | * | 5/1987 | Endoh et al. | 156/64 |
| 4,683,154 A | | 7/1987 | Benson et al. | |

(Continued)

FOREIGN PATENT DOCUMENTS

DE  298 23 351 U1  6/1999

(Continued)

OTHER PUBLICATIONS

Boedeker Plastics, Inc.: Acrylic Polymethyl-MethAcrylate PMMA datasheet, http://www.boedeker.com/acryl.html; May 7, 1999; pp. 1-2.

(Continued)

*Primary Examiner*—Tulsidas C. Patel
*Assistant Examiner*—Vladimir Imas
(74) *Attorney, Agent, or Firm*—Townsend and Townsend and Crew, LLP

(57) ABSTRACT

An electrical coupling device for solar cells includes a conductive member characterized by a single shaped thickness of material. The member includes a first portion extending a first length from a first end region and a second portion extending a second length from a second end region. The member also includes a U-like-shaped portion including a first branch, a second branch, and a joint region integrally connecting the first branch and the second branch. The first branch is integrally connected to the first portion at a first junction region and the second branch is integrally connected to the second portion at a second junction region. The first end region connects a first electrical lead of a first solar cell and the second end region connects a second electrical lead of a second solar cell which is disposed at flexible distance allowed by deforming the U-like-shaped portion elastically.

39 Claims, 11 Drawing Sheets

U.S. PATENT DOCUMENTS

| | | | | |
|---|---|---|---|---|
| 4,697,042 | A * | 9/1987 | Schilling | 136/244 |
| 5,006,179 | A * | 4/1991 | Gaddy | 136/244 |
| 5,080,725 | A | 1/1992 | Green et al. | |
| 5,118,361 | A | 6/1992 | Fraas et al. | |
| 5,158,618 | A * | 10/1992 | Rubin et al. | 136/244 |
| 5,180,888 | A * | 1/1993 | Sugiyama et al. | 174/94 R |
| 5,240,510 | A | 8/1993 | Goldade et al. | |
| 5,261,970 | A | 11/1993 | Landis et al. | |
| 5,466,301 | A | 11/1995 | Hammerbacher et al. | |
| 5,498,297 | A | 3/1996 | O'Neill et al. | |
| 5,616,186 | A * | 4/1997 | Fraas et al. | 136/253 |
| 5,707,459 | A | 1/1998 | Itoyama et al. | |
| 5,735,966 | A | 4/1998 | Luch | |
| 5,782,993 | A | 7/1998 | Ponewash | |
| 5,919,316 | A * | 7/1999 | Bogorad et al. | 136/256 |
| 6,034,322 | A * | 3/2000 | Pollard | 136/256 |
| 6,049,035 | A | 4/2000 | Tsuri et al. | |
| 6,057,505 | A | 5/2000 | Ortabasi | |
| 6,107,564 | A | 8/2000 | Aguilera et al. | |
| 6,150,602 | A * | 11/2000 | Campbell | 136/244 |
| 6,264,510 | B1 | 7/2001 | Onizuka et al. | 439/876 |
| 6,293,803 | B1 * | 9/2001 | Rust et al. | 439/33 |
| 6,294,723 | B2 | 9/2001 | Uematsu et al. | |
| 6,315,575 | B1 * | 11/2001 | Kajimoto | 439/33 |
| 6,323,415 | B1 | 11/2001 | Uematsu et al. | |
| 6,359,209 | B1 * | 3/2002 | Glenn et al. | 136/256 |
| 6,433,913 | B1 | 8/2002 | Bauer et al. | |
| 6,437,236 | B2 * | 8/2002 | Watanabe et al. | 136/251 |
| 6,441,297 | B1 * | 8/2002 | Keller et al. | 136/249 |
| 6,479,744 | B1 | 11/2002 | Tsuzuki et al. | |
| 6,528,718 | B2 | 3/2003 | Yoda et al. | |
| 6,617,505 | B2 * | 9/2003 | Shimada | 136/244 |
| 6,700,054 | B2 | 3/2004 | Cherney et al. | |
| 6,761,598 | B2 * | 7/2004 | Onizuka et al. | 439/876 |
| 6,809,250 | B2 * | 10/2004 | Gerson | 136/244 |
| 6,849,797 | B2 | 2/2005 | Koyanagi et al. | |
| 2003/0121542 | A1 | 7/2003 | Harneit et al. | |
| 2004/0084077 | A1 | 5/2004 | Aylaian | |
| 2004/0123895 | A1 | 7/2004 | Kardauskas et al. | |
| 2004/0246605 | A1 | 12/2004 | Stiles et al. | |
| 2006/0054211 | A1 | 3/2006 | Meyers et al. | |
| 2006/0099833 | A1 * | 5/2006 | Mann | 439/63 |

FOREIGN PATENT DOCUMENTS

| | | |
|---|---|---|
| EP | 0029721 | 6/1981 |
| EP | 784870 | 4/1996 |
| EP | 1 030 376 A1 | 8/2000 |
| EP | 1 427 025 A2 | 6/2004 |
| EP | 1 630 875 A2 | 3/2006 |
| EP | 1 732 141 A1 | 12/2006 |
| JP | 09018031 | 1/1997 |
| WO | WO 2006/123194 A1 | 11/2006 |
| WO | WO 2006/128417 A1 | 12/2006 |
| WO | WO 2007/036199 A2 | 4/2007 |

OTHER PUBLICATIONS

Solar Electricity Beginner Notes, http://www.sunwindsolar.com/a_lessons/solar_beginner_notes.html; Jan. 8, 2004; pp. 1-2.

* cited by examiner

ELECTRICAL COUPLING DEVICE AND METHOD FOR SOLAR CELLS

CROSS-REFERENCES TO RELATED APPLICATIONS

Not applicable.

STATEMENT AS TO RIGHTS TO INVENTIONS MADE UNDER FEDERALLY SPONSORED RESEARCH OR DEVELOPMENT

Not applicable.

REFERENCE TO A "SEQUENCE LISTING," A TABLE, OR A COMPUTER PROGRAM LISTING APPENDIX SUBMITTED ON A COMPACT DISK

Not applicable.

BACKGROUND

The present invention relates generally to solar energy techniques. In particular, the present invention provides a method and device for solar cell electrical coupling. Moreover, the present invention provides an electrical coupling device for interconnecting solar cells and/or connecting solar cells with external conducting leads. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the plant Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials. Such wafer materials are often costly and difficult to manufacture efficiently on a large scale. Availability of low-cost solar panels is also somewhat scarce because of limited sources of photovoltaic silicon bearing materials. These and other limitations are described throughout the present specification, and may be described in more detail below.

One of solutions for making low-cost solar panels is to assemble a plurality of solar cells each of which utilizes a light concentrator and less than 50% of photovoltaic materials. As an important element for assembling a plurality of solar cells, an electrical coupling device for interconnecting solar cells and/or for connecting solar cells with external conducting leads is highly desirable.

BRIEF SUMMARY OF THE INVENTION

The present invention relates generally to solar energy techniques. In particular, the present invention provides a method and device for solar cell electrical coupling. Moreover, the present invention provides an electrical coupling device for interconnecting solar cells and/or connecting solar cells with external conducting leads. Merely by way of example, the invention has been applied to solar panels, commonly termed modules, but it would be recognized that the invention has a much broader range of applicability.

In a specific embodiment, the present invention provides an electrical coupling device for solar cells. The device includes a conductive member characterized by a single shaped thickness of material. The member includes a first portion extending a first length from a first end region and a second portion extending a second length from a second end region. The member further includes a U-like-shaped portion including a first branch, a second branch, and a joint region integrally connecting the first branch and the second branch. The first branch is integrally connected to the first portion in a first angle at a first junction region and the second branch is integrally connected to the second portion in a second angle at a second junction region. Additionally, the device includes an electrical conductivity characteristic of the member. The electric conductivity is $30 \times 10^6$ $Sm^{-1}$ and greater. Moreover, the first end portion is configured to connect a first electric lead of a first solar cell and the second end portion is configured to connect a second electric lead of a second solar cell disposed at a distance away from the first solar cell. The distance is flexible in a range allowed by deforming the U-like-shape portion elastically.

In another specific embodiment, the present invention provides an alternative a electrical coupling device comprising a conductive member characterized by a single shaped thickness of material extending from a third end region to a fourth end region. The device further includes an electrical conductivity characteristic of the conductive member, the electric conductivity being $30 \times 10^6$ $Sm^{-1}$ and greater. Furthermore, the third end region of the electrical coupling device is configured to connect an electrical lead of a solar cell and the fourth end region is configured to connect an external connector.

In yet another specific embodiment, the present invention provides a method for electrically coupling solar cells for solar module package. The method includes providing a first solar cell which includes a first electrical lead. The method further includes providing at least a second solar cell disposed next to the first solar cell with an approximate distance. The second solar cell includes a second electrical lead and a third electrical lead coupled to the second electrical lead. Additionally, the method includes providing a first electrical coupling device which comprises a conductive member made from a single shaped thickness of material including a first portion with a first end region, a second portion with a second end region, and a U-like-shaped portion with two branches integrally coupled with the first portion and the second portion respectively. Moreover, the method includes coupling the first end region to the first electrical lead and the second end region to the second electrical lead while the U-like-shaped portion is disposed between the first solar cell and the second solar cell. The first portion, the second portion, and a spread of the two branches of the U-like-shaped portion provide an effective length to accommodate the proximate distance with flexible variations.

In another specific embodiment, the method further includes providing a third solar cell disposed next to the second solar cell with substantially the same proximate distance. The third solar cell is made substantially the same as the second solar cell. The method also includes providing a second electrical coupling device, which is made substantially the same as the first electrical coupling device. Moreover, the method includes coupling the third solar cell to the second solar cell using the second electrical coupling device. Furthermore, the method include providing a third electrical coupling device, which comprises a conductive member characterized by a single step-shaped thickness of material. The method then includes coupling the third solar cell to an external connector using the third electrical coupling device.

In yet another specific embodiment, the present invention provides a solar module with inter-coupled solar cells. The solar module includes a first solar cell, a second solar cell disposed next to the first solar cell with an approximate separation, and a first coupling device configured to electrically couple the first solar cell to the second solar cell. The first coupling device includes a conductive member characterized by a single shaped thickness of material. The member includes a first portion extending a first length from a first end region, a second portion extending a second length from a second end region, and a U-like-shaped portion including a first branch, a second branch, and a joint region integrally connecting the first branch and the second branch. The first branch is integrally connected to the first portion in a first angle at a first junction region. The second branch is integrally connected to the second portion in a second angle at a second junction region. Additionally, the member includes an electrical conductivity being $30 \times 10^6$ $Sm^{-1}$ and greater. Furthermore, the first end portion is configured to connect a first electric lead of the first solar cell and the second end portion is configured to connect a second electric lead of the second solar cell with the approximate separation being in a range allowed by deforming the U-like-shaped portion elastically.

In yet still another specific embodiment, the solar module further includes a third solar cell, which is made substantially the same as the second solar cell. The solar module also includes a second coupling device electrically coupled to the third solar cell and the second solar cell. The second coupling device is made substantially the same as the first coupling device. Furthermore, the solar module includes a third coupling device electrically coupled to the third solar cell and an external connector. The third coupling device comprises a conductive member characterized by a single shaped thickness of material.

Many benefits are achieved by way of the present invention over conventional techniques. For example, embodiments of the present invention provide an electrical coupling device having a rigid mechanical connection between two solar cells using a conductive member characterized by a single shaped thickness of material. At the same time, a U-like-shaped portion of the same single shaped thickness of material provides a flexible characteristic so that the electrical coupling device allows varying distances between the two solar cells due to thermal expansion or contraction. A specific embodiment allows a range of 0 to 12 mm for such a distance as an assembled solar panel or module operating in the field. Certain embodiments of the present invention comprises a step-shaped structure for its two end regions configured to couple with the electrical lead of each solar cell. Coupling between the end region of the electrical coupling device and the electrical lead of the solar cell can be achieved by soldering or laser welding. Depending upon the embodiment, one or more of these benefits, as well as other benefits, may be achieved. These and other benefits will be described in more detail throughout the present specification and more particularly below in conjunction with the following drawings.

DETAILED DESCRIPTION OF THE EMBODIMENTS

The present invention relates generally to solar energy techniques. In particular, the present invention provides a method and device for solar cell electrical coupling. Moreover, the present invention provides an electrical coupling device for interconnecting solar cells and/or connecting solar cells with external conducting leads. Merely by way of example, the invention has been applied to solar panels, commonly termed modules, but it would be recognized that the invention has a much broader range of applicability.

Figure 1:
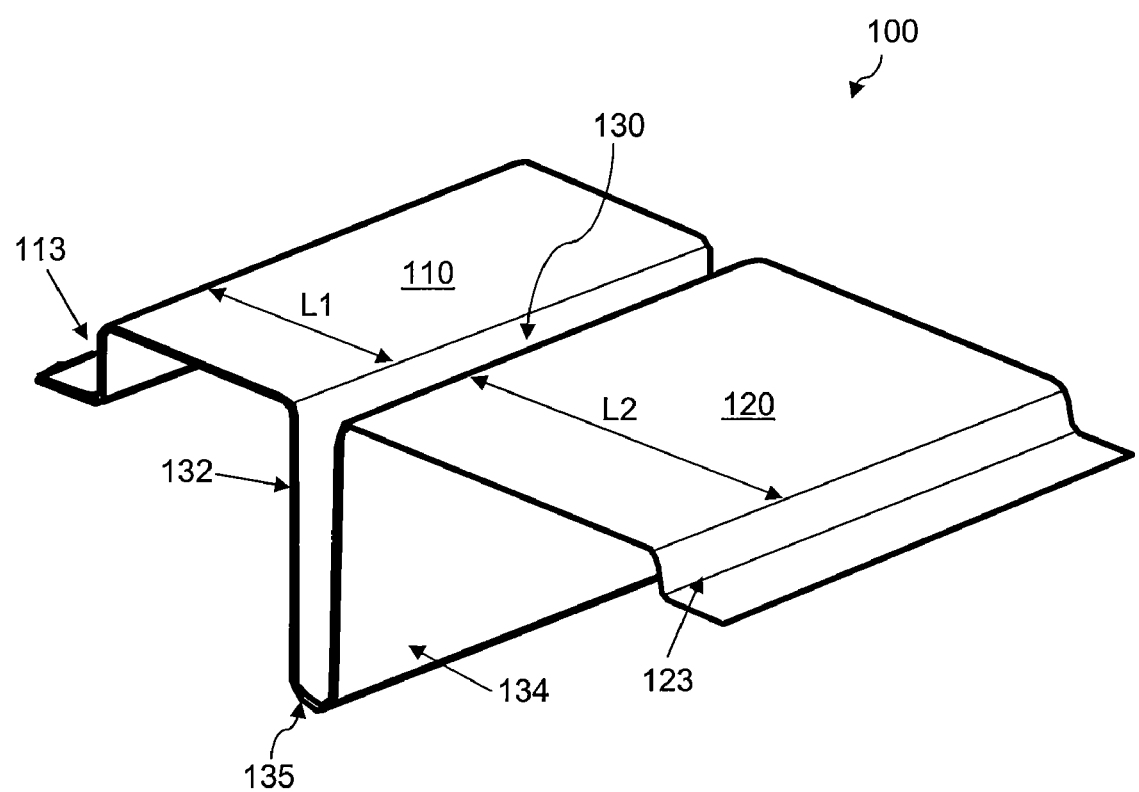
FIG. 1 is a prospective view of an electrical coupling device for solar cell according to an embodiment of the present invention.

FIG. 1 shows a prospective view of an electrical coupling device for solar cell according to an embodiment of the present invention. This figure is merely an illustration and should not limit the scope of the claims herein. As shown, a conductive member 100 include a single shaped thickness of material comprising a first portion 110 extending a first length L1 from a first end region 113. The single shaped thickness of material also has a second portion 120 extending a second length L2 from a second end region 123. The first portion 110 with the length L1 integrally joins with an uprising first branch 132 of a U-like-shaped portion 130. The second portion 120 with the length L2 integrally joins with another uprising second branch 134 of the same U-like-shaped portion 130, while the two branches integrally join together at a bottom joint region 135. Lengths L1 and L2 may be the same or different depending on the configuration of the solar cells that is to be coupled by the electrical coupling device. An effective length for the electrical coupling device includes L1, L2, a spread of U-like-shaped portion and some additional lengths of two end portions. For example, the effective length may be in a range of 0.5 inches to 1 inches.

Figure 1A:
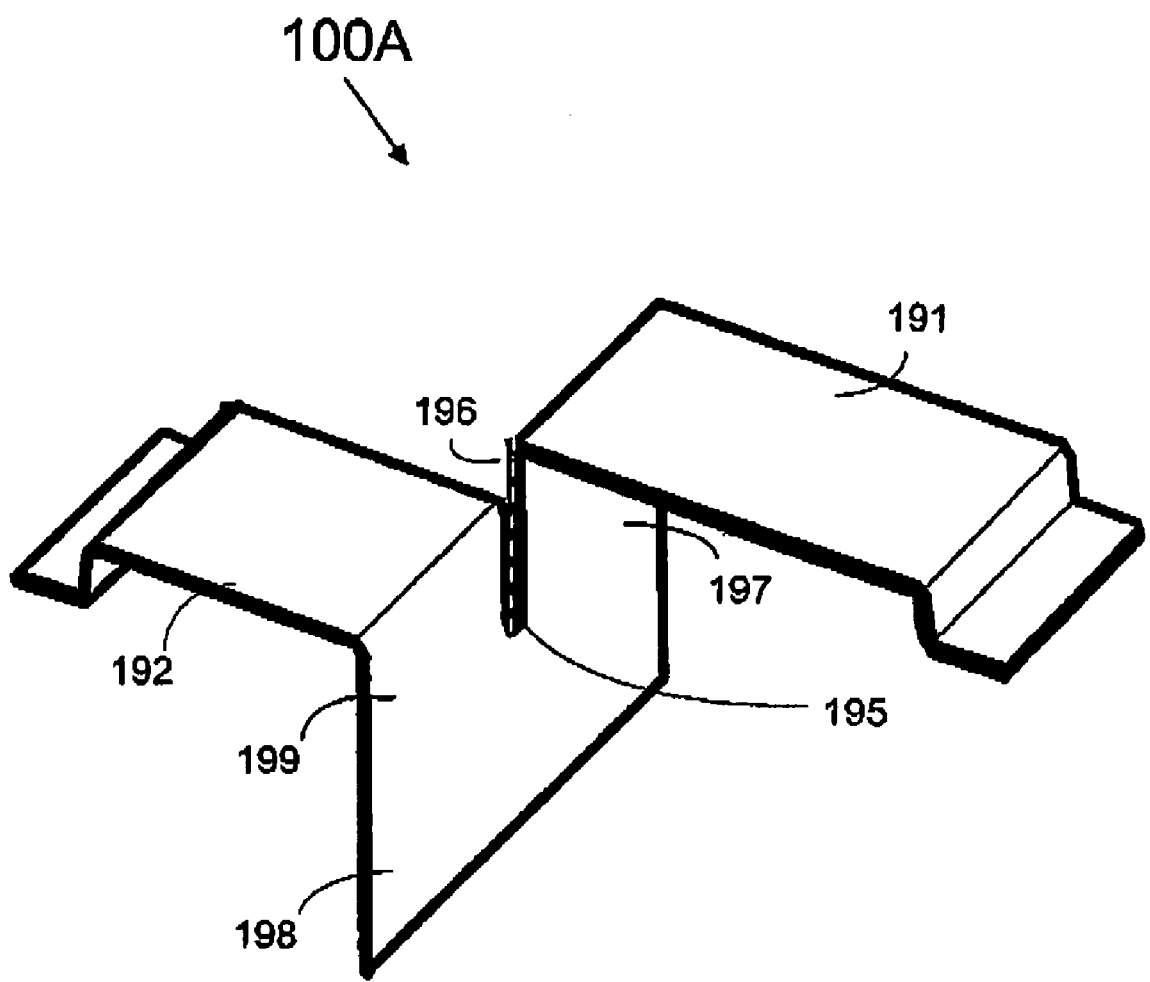
FIG. 1A is a prospective view of an electrical coupling device for solar cell according to another embodiment of the present invention.

In one embodiment, the single shaped thickness of material has a thickness t and is made from one or a combination of materials selected from copper, aluminum, molybdenum, tin, chromium, and iron. In another embodiment, the single shaped thickness of material is characterized by an electrical conductivity of $30 \times 10^6$ $Sm^{-1}$ or greater and effectively allows an electrical current up to 6 Amp to pass through. Of course, there can be other alternatives, variations, or modifications. For example, FIG. 1A shows a prospective view of an alternative electrical coupling device for solar cell according to an embodiment of the present invention. As shown, the U-like-shaped portion is replaced by a single branch with a half slit in the middle. Each side of the slit further connects a portion of the coupling device that is similar to either the first portion 110 or the second portion 120. As shown in FIG. 1A, the couple device includes a sheet metal portion 198. The sheet metal portion is characterized by a thickness, a length, and a width. The sheet metal portion 198 includes a slit 196 positioned at substantially a center portion of the sheet metal. The slit 196 is characterized is shorter than the length. The sheet metal portion 198 includes a third portion 197 and a fourth portion 199. The third portion 197 is substantially on a same plane as the fourth portion 199. The third portion 197 having a greater length than the fourth portion 199. The third portion 197 and the fourth portion 199 are separated by the slit 196. The third portion 197 is integrally connected to the first portion 191. The fourth portion 199 is integrally connected to the second portion 192. The first portion 191 is substantially perpendicular to the third portion 197. The second portion 192 is substantially perpendicular to the fourth portion 199. Further details about the structure of the electrical coupling device may be found in the description throughout this specification and particularly below.

Figure 2A:
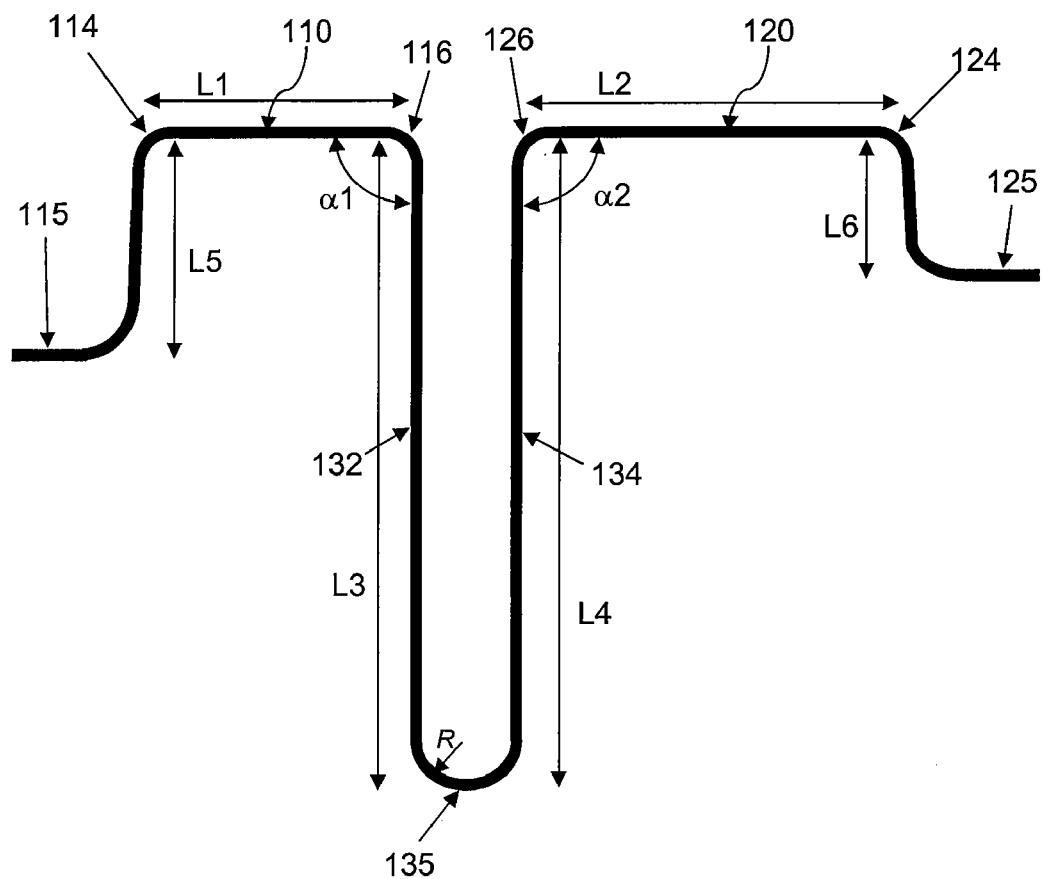
FIG. 2A is a schematic side view of the electric coupling device of FIG. 1 in one static state for coupling solar cells according to an embodiment of the present invention.

FIG. 2A is a schematic side view of an electric coupling device in one static state for coupling solar cells according to an embodiment of the present invention. This figure is merely an illustration and should not limit the scope of the claims herein. Following the description of the electrical coupling device in FIG. 1, the single shaped thickness of material in the side view is shown as a continuous thick line. As shown, in one embodiment, the first end region is a step-shaped structure ending with an upper step edge 114 and a lower step 115, having a step height L5 between 114 and 115. For example, the lower step 115 may be used for coupling to one of electrical leads on a solar cell. Similarly, the second end region also has a step-shaped structure with a step height L6 between an upper step edge 124 and a lower step 125, which may be used for coupling to another one of electrical leads of a neighboring solar cell. Depending on the solar cell electrical lead design and coupling method, the lower steps 115 and 125 may be selected to have different lengths and widths. In one embodiment, the step height L5 is different from the step height L6 so that one step region can connect to an electrical lead on front side of photovoltaic chips in a solar cell and the other step region can connect to another electrical lead on back side of photovoltaic chips in a neighboring solar cell. For example, height L5 and L6 may be in a range of 0.1 inches to 0.5 inches. In another embodiment, both end regions may couple to electrical leads that are connected to the same side of photovoltaic chips. In yet another embodiment, the electrical leads connected to different sides of photovoltaic chips may be configured to accommodate substantially the same height of L5 and L6.

In a specific embodiment, the first branch 132 joins with the first portion 110 at a first junction edge 116 forming a first angle $\alpha 1$ and the second branch 134 joins with the second portion 120 at a second junction edge 126 forming a second angle $\alpha 2$. The first length L1 of the first portion 110 is measured from the step edge 114 to the first junction edge 116. Similarly, the second length L2 of the second portion 120 is measured from another step edge 124 to a second junction edge 126. In another specific embodiment, the bottom joint region 135 is a curved plane with a radius of curvature R, shown as a semi-circle in this side view diagram. The first branch 132 may be characterized by a length L3 between the first junction edge 116 and the bottom joint region 135 and the second branch also may be characterized by a length L4 between the second junction edge 126 and the bottom joint region 135. For example, the lengths L3 and L4 may be in a range of 0.5 inches to 1 inches.

Figure 2B:
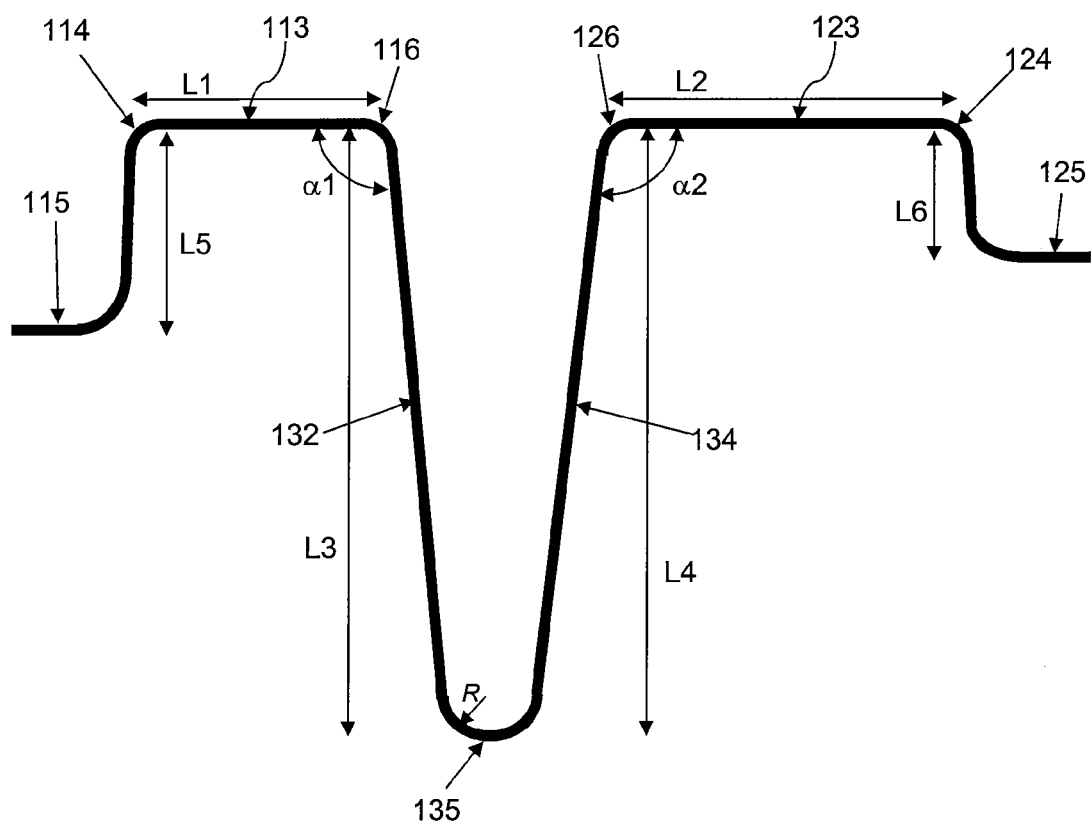
FIG. 2B is a schematic side view of the electric coupling device of FIG. 1 in another static state for coupling solar cells according to an embodiment of the present invention.

In another specific embodiment, the single shaped thickness of material may be elastically deformed from one static state to another. For example, FIG. 2A just illustrates one of the various static state at which the first angle $\alpha 1$ and the second angle $\alpha 2$ each may be substantially equal to a 90 degree angle. In this state, the two branches 132 and 134 are nearly parallel to each other so that the spread between the first junction edge 116 and the second junction edge 126 may be substantially equal to a distance of two times the radius of curvature R of the bottom joint region. In another example, FIG. 2B illustrates another static state of the same electrical coupling device according to an embodiment of the present invention. This figure is merely an illustration and should not limit the scope of the claims herein. As shown, in this static state the first angle α1 and the second angle α2 each becomes bigger than that in the static state shown in FIG. 2A. One characteristic of this static state is that the spread between the first junction edge 116 and the second junction edge 126 also becomes bigger than 2R. The two branches of the U-like-shaped portion are no longer parallel to each other, turning the U-like shape to a V-like shape. Alternatively, the U-like-shaped portion may be deformed in opposite way so that the spread between the first junction edge 116 and the second junction edge 126 also becomes closer to each other with a separation smaller than 2R. In yet another embodiment, the above inward or outward deformation of the U-like-shaped portion can be kept in an elastic region provided a proper selection of mechanical hardness/stiffness of the single shaped thickness of material. For example, for copper with soft-to-medium hardness in thickness ranging from 0.003 inches to 0.2 inches, the U-like-shaped portion can be elastically deformed to be fit in a separation between two solar cells ranging from 0.005 inches to 0.5 inches. Of courses, there can be many variations, alternatives, and modifications.

Figure 3A:
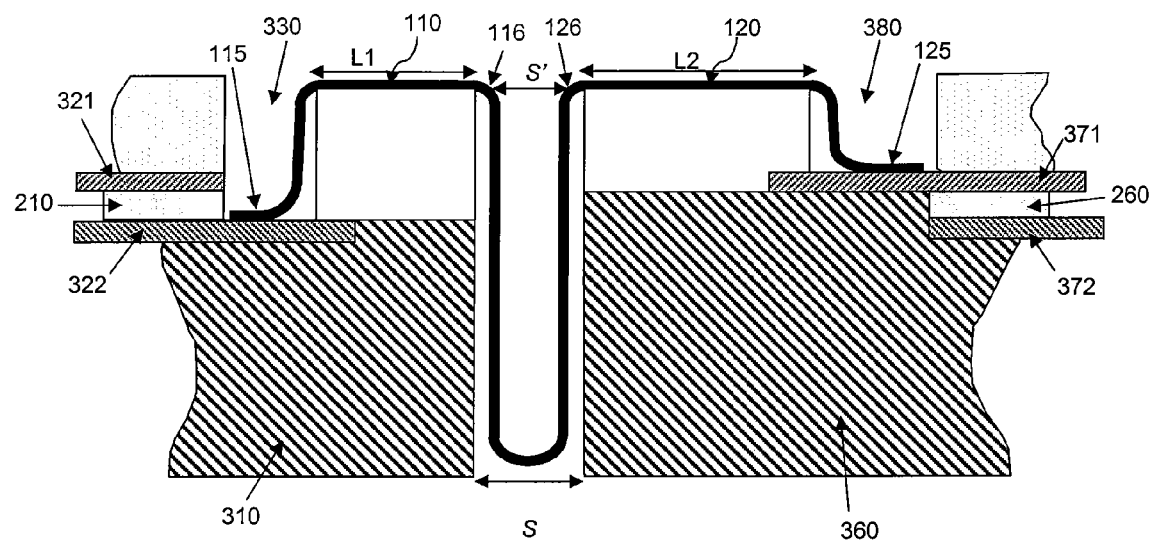
FIG. 3A is a simplified diagram illustrating a side view of an electrical coupling device in position to couple two solar cells according to an embodiment of the present invention.

FIG. 3A is a simplified diagram illustrating a side view of an electrical coupling device in position to couple two solar cells according to an embodiment of the present invention. This diagram is merely an illustration and should not limit the scope of the claims herein. One of skilled in the art should recognize many alternatives, variations, and modifications. As shown, a first solar cell 310 on the left has an electrical lead 322 revealed in a slot 330 through an encapsulate material. The electrical lead 322 is electrically coupled to front side of a photovoltaic chip 210 in the first solar cell 310 while another electrical lead 320 connects the back side of the same photovoltaic chip 210. In one embodiment, the slot 330 is disposed in a peripheral region on a back cover of the first solar cell 310. For example, the slot 330 is located at a distance range substantially around L1 and has a depth substantially equal to L5 or less. Basically, the slot 330 can be configured to let the first end region 113 of the electrical coupling device 100 being inserted in so that the lower step 115 is in a position to partially contact with the electrical lead 322. In addition, the opening of the slot 330 is allowed the solders being added in. With certain controlled heat flux a soldering bonding between the electrical coupling device 100 and the first solar cell 310 is formed. In one example, the lower step 115 and extended region may be coated with a layer of tin/lead alloy or nickel/tin alloy by plating for enhancing the bonding during soldering process. In an alternative embodiment, laser welding process may be performed to form bonds between the lower step 115 and the exposed electrical lead 322.

In one embodiment, the same coupling mechanism can be applied for the second end region of the same electrical coupling device 100 to couple with a second solar cell 360. As shown in FIG. 3A, the second solar cell 360 is disposed next to the first solar cell 310 with an approximate separation S between respective edges. In a specific embodiment, the second solar cell 360 includes a slot 380 with an electrical lead 371 being partially exposed. The slot 380 is disposed near a peripheral location with an approximate distance around L2 from an edge of the second solar cell 360. The slot 380 has depth substantially equal to L6 or less so that the lower step 125 of the second end region of the electrical coupling device 100 can properly make contact with the electrical lead 371. In particular, the slot 380 is associated with the slot 330 when the first solar cell 310 and the second solar cell 360 in their supposed package positions. Accordingly, as shown in FIG. 3A the electrical coupling device 100, which has a first portion 110 in length L1 and a second portion 120 in length L2 and a U-like-shaped portion with a spread S', is in position to couple the first solar cell 310 to the second solar cell 360. As a matter of fact, depending on mechanical hardness/stiffness the electrical coupling device with the U-like-shaped portion may provide necessary flexibility in the spread separation S' to fit the approximate cell separation S between the first solar cell and the second solar cell. For example, S can be in a range from 0.005 inches to 0.5 inches. In a preferred embodiment, the spread separation S' is slightly smaller than the cell separation S, as shown in FIG. 3B due to a small curvature of the two junction regions 116 and 126.

In one example as shown in FIG. 3A, the electrical lead 371 to be coupled by the lower step 125 of the second end region of the electrical coupling device 100 is an electrical bus bar connected to a back side of a photovoltaic chip 260 in the second solar cell 360. The electrical lead 372 connecting to a front side of the photovoltaic chip 260 is embedded and not exposed. Therefore after inter-connection using the electrical coupling device, the first solar cell couples to the second solar cell form are in series. In an alternative embodiment, multiple solar cells may be first coupled in parallel in one group with front side electrical leads being connected and back side electrical leads being connected separately. Then a first group of solar cells are coupled to the second group of solar cells using one or more coupling devices to connect the front side electrical leads of one group and the back side electrical leads of the next group.

Figure 3B:
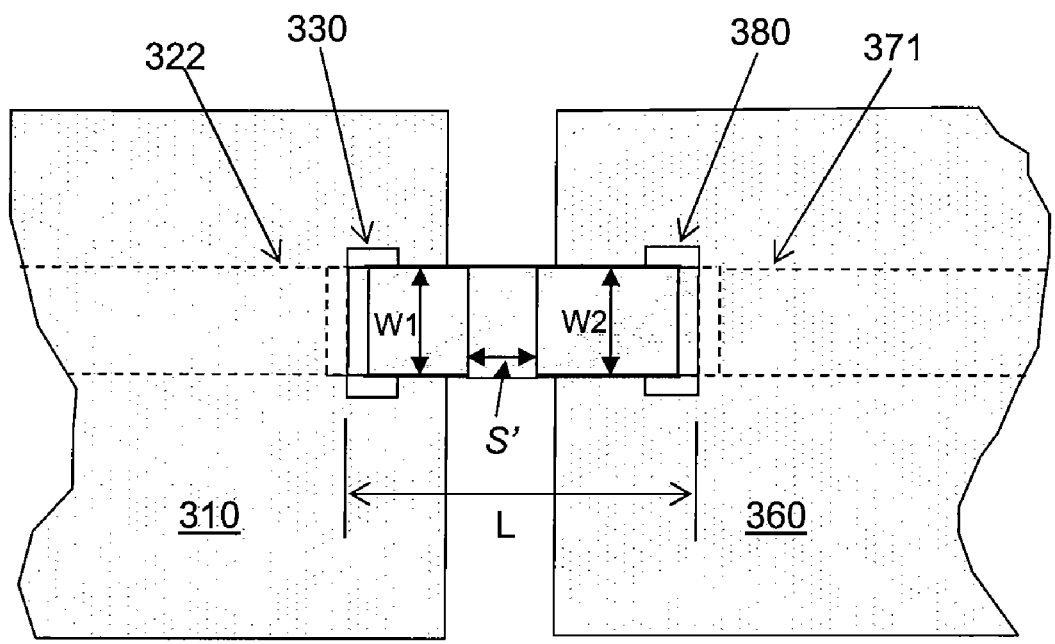
FIG. 3B is a simplified diagram illustrating a top view of the electrical coupling device of FIG. 3A according to an embodiment of the present invention.

FIG. 3B is a simplified diagram illustrating a top view of FIG. 3A. This diagram is merely an illustration and should not limit the scope of the claims herein. One of skilled in the art should recognize many alternatives, variations, and modifications. As shown, the first end region 113 is buried in the slot 330 of the first solar cell with a partial portion of the first portion 110 being exposed. In this top view, the first portion 110 is shown to be in rectangular shape with a length L1 and a width W1. Similarly, the second end region 123 is buried in the slot 380 of the second solar cell to complete the electrical connection between the electrical lead 322 on the first solar cell and the electrical lead 371 on the second solar cell. As seen, the second portion is partially exposed in a rectangular shape with a length L2 and a width W2. In one embodiment, the widths W1 and W2 may be the same. For example, the widths W1 and W2 may be in a range of 0.05 inches to 0.5 inches. In another example, the width W1 and the width W2 may be different. In yet another embodiment, the shape of either the first portion or the second portion may be in other shape. For example, W2 is smaller than W1. The shape of the first portion can be a trapezoidal shape with reducing widths from the junction edge to the step edge. Of course, there can be many alternatives, variations, and modifications.

As shown in FIG. 3B, the junction portion 130 with the top view of a spread S' between two branches is disposed in between the two solar cells. In one embodiment, intrinsic mechanical hardness/stiffness and a U-like-shaped portion allow the electrical coupling device capable of being elastically deformed to have a narrower or wider spread S'. Depending on the physical separation between the two solar cells, the spread S' can be varied to accommodate the physical separation with slightly increasing or decreasing the angle between the two branches of the U-like-shaped portion. Certain embodiments, as shown in FIG. 3B, provides an effective length L of the electrical coupling device connecting two solar cells from one end to another including the first portion L1 and second portion L2, the spread S', and two lower step lengths. For example, the effective length L may be in a range of 0.5 inches to 1 inches.

Figure 3C:
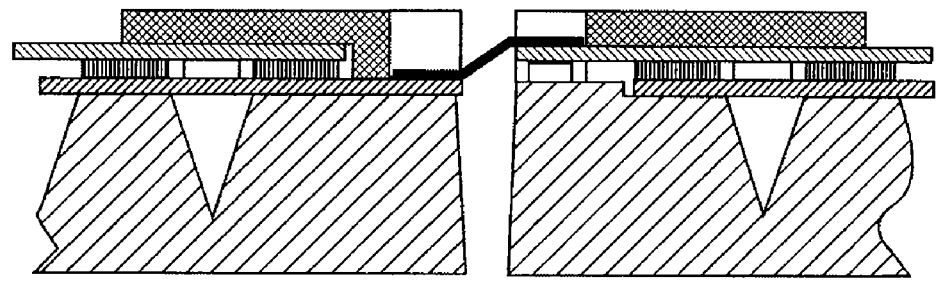
FIGS. 3C-3E are simplified diagrams showing alternative electrical coupling devices in position to couple two solar cells according certain embodiments of the present invention.
Figure 3D:
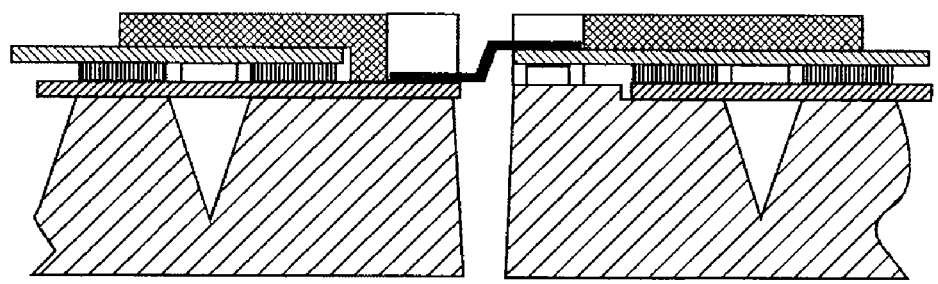
Figure 3E:
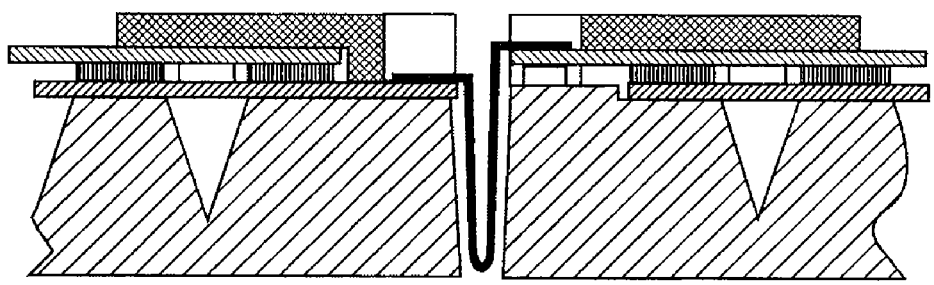

FIGS. 3C-3E also show side views of two solar cells being connected by an electrical coupling devices in several other forms according to certain embodiments of the present invention. These diagrams are merely illustrations and should not limit the scope of the claims herein. One of skilled in the art should recognize many alternatives, variations, and modifications. For example, the end regions of these electrical coupling devices are simply straight without the step-shaped structure. The middle portions are either a simple direct connection between two end regions or use a U-like shaped structure. In another example, the effective length of these electrical coupling devices are adapted to fit the relative mounting locations of two neighboring solar cells. Accordingly, the electrical leads on the solar cells may need to be modified for adapting any end regions variations of different electrical coupling devices or vise versa.

Figure 4:
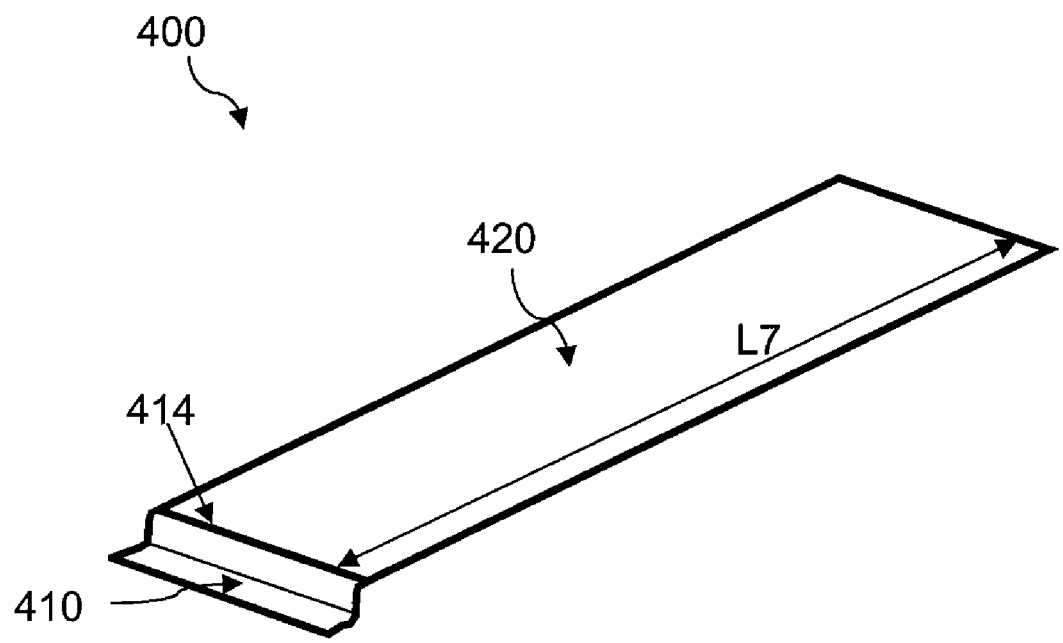
FIG. 4 is a prospective view of another electrical coupling device for solar cell according to an alternative embodiment of the present invention.

FIG. 4 is a prospective view of another electrical coupling device for solar cell according to an alternative embodiment of the present invention. This diagram is merely an illustration and should not limit the scope of the claims herein. One of skilled in the art should recognize many alternatives, variations, and modifications. As shown, this electrical coupling device 400 is a conductive member comprising a single shaped thickness of material. For example, the single shaped thickness of material has a thickness t, in a range of 0.003 inches to 0.02 inches. In another example, the single shaped thickness of material is made from one or a combination of copper, aluminum, molybdenum, tin, chromium, and iron with an electrical conductivity of $30 \times 10^6$ $Sm^{-1}$ or greater. In a specific embodiment, the electrical coupling device 400 has a simple step-shaped structure with a short lower step 410 and an upper step edge 414 and an extended upper step 420 with a length L7. The end region with the lower step 410 has similar geometrical shape and dimension as the first end region 113 of electrical coupling device 100. As a matter of fact, this end is used to couple the electrical lead of a solar cell the same way as the electrical coupling device 100. In another specific embodiment, the opposite end region is for coupling an external connector of a solar module. The length L7 is adapted to the distance between the last solar cell near the edge of the solar module and the external connector. For example, the length L7 may be in a range of 0.5 inches to 3 inches. Of courses, there can be many variations, alternatives, and modifications.

Figure 5A:
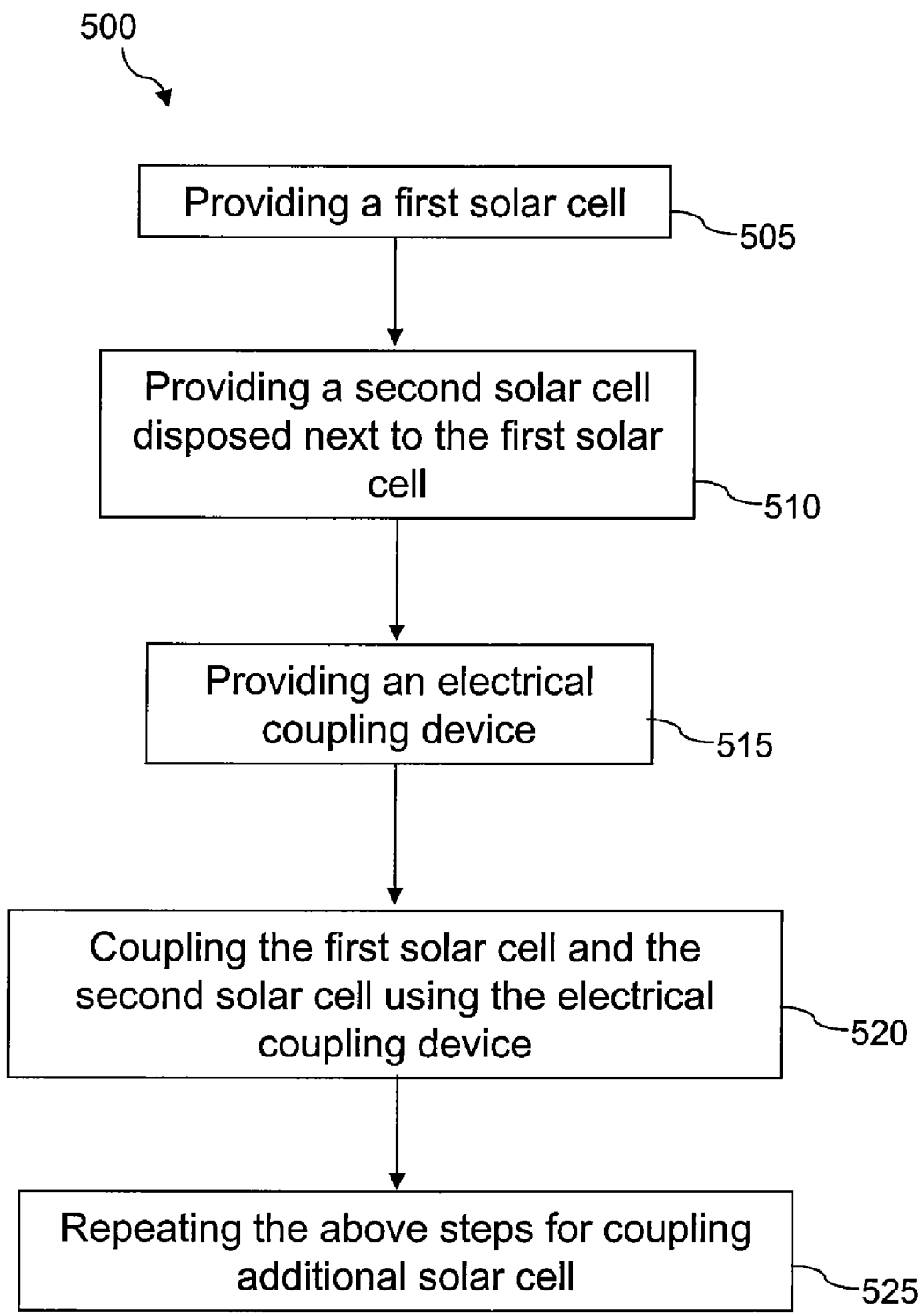
FIG. 5A is a simplified flowchart illustrating a method for electrically interconnecting solar cells according to an embodiment of the present invention.

FIG. 5A is a simplified flowchart illustrating a method for electrically interconnecting solar cells according to an embodiment of the present invention. This diagram is merely an illustration and should not limit the scope of the claims herein. One of skilled in the art should recognize many alternatives, variations, and modifications. The method 500 includes providing a first solar cell (505). The first solar cell including a first electrical lead partially exposed at a peripheral location. The method 500 also includes providing at least a second solar cell disposed next to the first solar cell (510). The second solar cell includes at least a second electrical lead partially exposed at a peripheral location of the second solar cell which is opposed with an proximate distance to the first electrical lead of the first solar cell. The method 500 further includes providing an electrical coupling device (515). The electrical coupling device includes a conductive member made of a single shaped thickness of material. The conductive member includes a first portion having a first end region and a first length, a second portion having a second end region and a second length, and a U-like-shaped portion integrally connecting the first portion and the second portion. The method 500 then includes coupling the first end region to the first electrical lead and the second end region to the second electrical lead (520). The first/second end region is physically adapted to fit with the exposed part of the first/second electrical lead. The first/second length is adapted to one/another distance between the respective coupling location and the edge of the first/second solar cell so that the U-like-shaped portion is disposed in the gap between the first solar cell and the second solar cell. Moreover, the method 500 includes repeating the above processes to continue inter-coupling additional neighboring solar cells (525). The electrical conductivity characteristic of each conductive member used ensures an ability to pass photo-electrical current generated by all the inter-coupled solar cells. In addition, selection of soft-to-medium hardness of the single shaped thickness of material and certain structural shape of the junction portion of the conductive member allows one solar cell to be coupled to a neighboring solar cell with certain flexibility. In one embodiment, the method 500 provides, at least partially, a process of packing a solar module by inter-coupling solar cells.

Figure 5B:
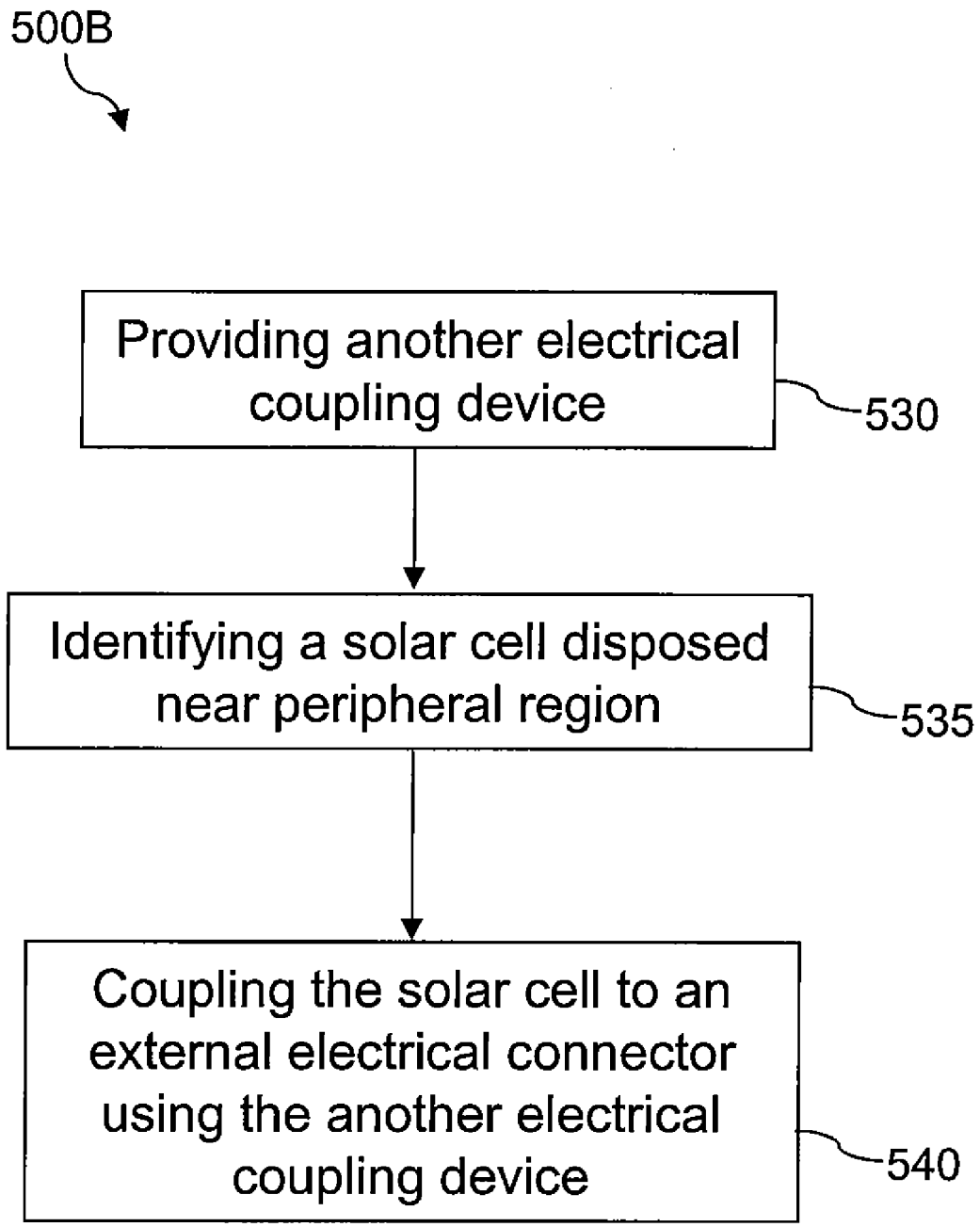
FIG. 5B is a simplified flowchart illustrating a method for electrically connecting solar cell with an external conductor according to an alternative embodiment of the present invention.

FIG. 5B is a simplified flowchart illustrating a method for electrically connecting solar cell with an external conductor according to an alternative embodiment of the present invention. As shown the method 500B includes a step for providing an alternative electrical coupling device (530). The alternative electrical coupling device includes a conductive member characterized by a single shaped thickness of material. The single shaped thickness of material includes a step-shaped structure on one end and a straight another end. The method 500B further includes a step for identifying a solar cell with an electrical lead exposed in a slot (535). In particular, the solar cell is disposed near a peripheral region of the solar module. The method 500B then includes coupling the alternative electrical coupling device to a solar cell and an external connector (540). In particular, the step-shaped structure on one end of the electrical coupling device is used to couple an electrical lead on the solar cell. The straight another end of the electrical coupling device is used to couple the external connector. Of course, the above sequence of steps is merely an illustration and should not limit the scope of the claims herein. One of skilled in the art should recognize many alternatives, variations, and modifications. For example, more steps may be added to making electrical coupling between the solar cell with other solar cell. These added steps may be performed before or after or in between the listed above steps. In another example, some steps may be added to include selecting one or more solar cells for coupling to external connectors, disposing the solar cells in order, or aligning the solar cells in certain direction before coupling. In certain embodiments, both the method 500 and the method 500B are used for packaging one solar module. Depending on the applications, the combinational usage of the method 500 and the method 500B may vary.

Figure 6:
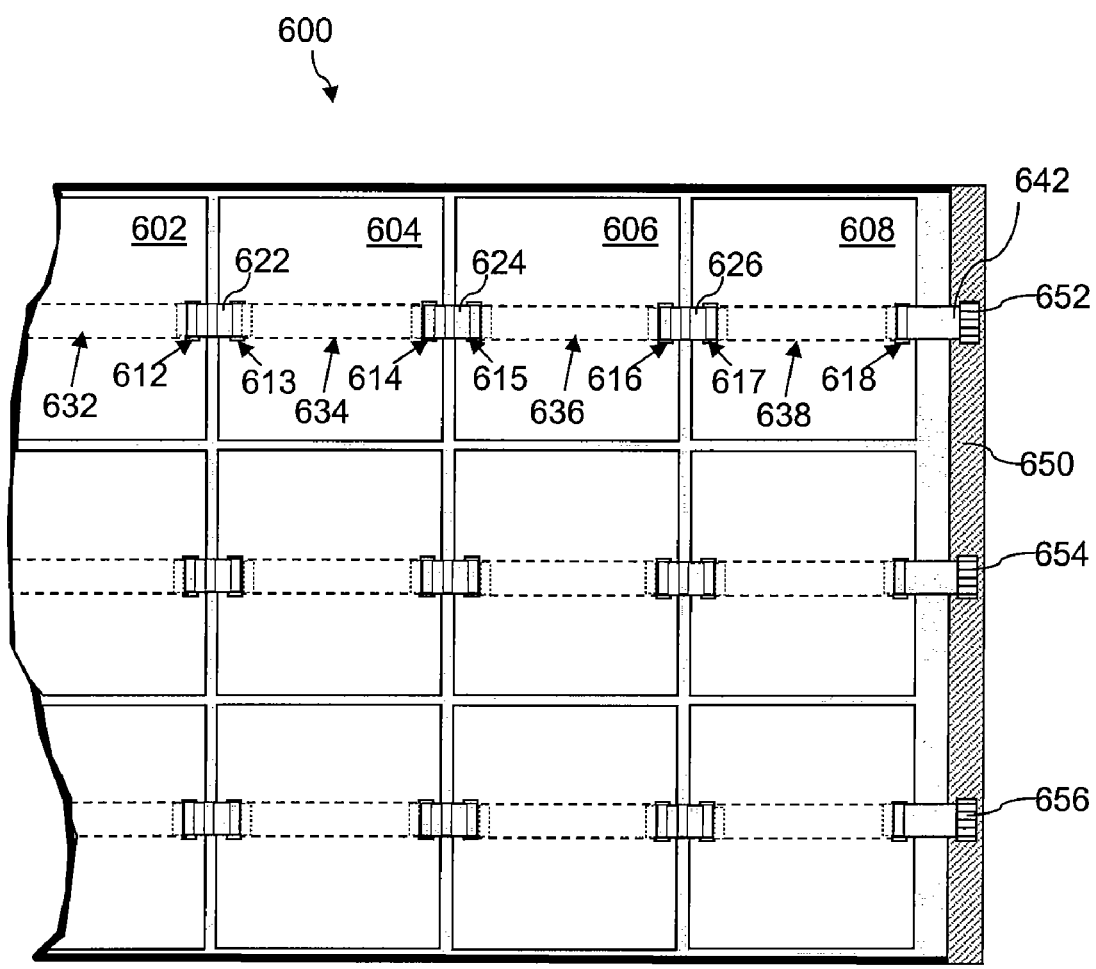
FIG. 6 is a simplified diagram illustrating partially a solar module according to an embodiment of the present invention.

FIG. 6 is a simplified diagram illustrating partially a solar module according to an embodiment of the present invention. This diagram is merely an illustration and should not limit the scope of the claims herein. One of skilled in the art should recognize many alternatives, variations, and modifications. As shown, the solar module 600 includes a plurality of solar cells 602, 604, 606, 608 etc coupled in series by electrical coupling devices 622, 624, 626, etc. Each solar cell may be a self-packaged unit including a bottom cover member and a top cover member enclosing a plurality of photovoltaic regions. The top cover member may include a light concentrator that is capable to concentrate light illuminated on the top cover member to an area at least one half or less than that of the top cover member. In addition, each solar cell has one or more built-in conductors 632, 634, 636, 638, etc. for coupling the plurality of photovoltaic regions to collect a photo-electrical current generated during operation. The conductors may be a metal bus bar that couples to either front sides of the plurality of photovoltaic regions of one solar cell or back sides of the plurality of photovoltaic regions of a neighboring solar cell. For example, the solar cell is a 125×125 mm SuperCell packaged by Solaria Corporation located at 46420 Fremont Boulevard, Fremont, Calif. 94538 USA. In another example, the solar cell may be a 150×150 mm Q-cell produced by Q-Cells AG Guardianstrasse 16, 06766 Thalheim, Germany. Of course, there can be many alternatives, variations, and modifications. For example, the solar cell includes any photovoltaic cell packaged with light concentrator over a plurality of photovoltaic regions connected by one or more conductive members which respectively couple with either a front electrode or a back electrode of each photovoltaic cell.

In a specific embodiment, for a packaged solar cell only a small fraction of the conductor is made to be exposed at a slot near a peripheral region of the solar cell through both an encapsulating material and the bottom cover member. The slot is pre-structured to allow insertion of an electrical coupling device to make connection thereof. For example, the slot 612 exposing a fraction of the conductor 632 becomes an electrical lead for the solar cell 602. In another example, slots 613 and 614 each exposing a fraction of the conductor 634 become electrical leads for the solar cell 604. In yet another example, the electric coupling device 622 is configured to connect the electric lead at slot 612 by its first end region and connect the electric lead at slot 613 by its second end region. The conductor 632 may be coupled to front side of the photovoltaic region in solar cell 602 and the conductor 634 may be coupled to back side of the photovoltaic region in solar cell 604. For each solar cell there can be multiple electrical leads disposed on the same side or on the opposite side of the cell body. The locations of the electrical leads are predetermined so that desired alignment from cell to cell in the module can be easily achieved.

In another embodiment, each of the electrical coupling devices is characterized by a single shaped thickness of material with electric conductivity up to a certain value for allowing photo-electrical current to pass. For example, each of the electrical coupling devices 622, 624, 626 etc is an electrical coupling device 100 described earlier. In particular, the a single shaped thickness of material includes a first portion with a first end region, a second portion with a second end region, and a U-like-shaped portion having two branches each integrally connected the first portion and the second portion respectively. The first end region is adapted for coupling one electrical lead in a slot of a first solar cell and the second end portion accordingly is adapted for coupling another electrical lead in another slot of a second solar cell, which has be disposed with alignment at an approximate distance next to the first solar cell. In another specific embodiment, the electrical coupling device is coupled to both the first solar cell and the aligned second solar cell such that the U-like-shaped portion is disposed in a gap between cells. Depending on the selection of material hardness/stiffness for the single shaped thickness of material the U-like shaped portion may allow the two branches elastically deformable to spread either wider or closer, providing an accommodation to the approximate distance between the first solar cell and the second solar cell with flexible variations. In one example, the approximate distance between each neighboring solar cell pairs can be allowed in a range from 0.005 inches to 0.5 inches. Of course, there can be many alternatives, variations, and modifications.

In a specific embodiment, the coupling between the electrical coupling device and the electrical lead on the solar cell can be performed by soldering or laser welding. The electrical coupling device can be made from one or a combination of materials selected from copper, aluminum, molybdenum, tin, chromium, and iron. In particular, the two end regions of each electrical coupling device can be plated with tin/lead alloy or nickel/tin alloy, helping to enhance the solderability between the electrical coupling device and the electrical lead on the solar cell. For example, the electrical coupling device in use possesses at least an electrical conductivity of $30 \times 10^6$ $Sm^{-1}$, a thickness ranging from 0.003 inches to 0.2 inches, a base width ranging from 0.05 inches to 0.5 inches, and should be capable of allowing an electrical current up to 6 Amp to pass.

In yet another embodiment, FIG. 6 also shows another part of the module package including a coupling between a solar cell 608 and an external connector 652 by an alternative electrical coupling device 642. For example, the alternative electrical coupling device is the device 400 described earlier in the specification. In particular, one end region of the electrical coupling device 642 is adapted for coupling to the electrical lead 618 on the solar cell 608. The other end region of the electrical coupling device 642 can be a straight end for coupling an external connector 652. Of course, other shape of the other end region may be adapted to match with a different type of external connector. One of skilled in the art should recognize many alternatives, variations, and modifications. In one embodiment, there may be multiple external connectors 652, 654, 656, etc for the solar module 600. In other embodiment, all of these external connector have coupled to a common electrode 650 for the module 600.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electrical coupling device for solar cells, the device comprising:
    a conductive member characterized by a single shaped thickness of material, the member comprising:
        a first portion extending a first length from a first end region;
        a second portion extending a second length from a second end region;
        a sheet metal portion characterized by a thickness, a length, and a width, the sheet metal portion including a slit positioned at substantially a center portion of the sheet metal, the slit being characterized being shorter than the length, the sheet metal portion including a third portion and a fourth portion, the third portion being substantially on a same plane as the fourth portion, the third portion having a greater length than the fourth portion, the third portion and the fourth portion being separated by the slit, the third portion being integrally connected to the first portion, the fourth portion being integrally connected to the second portion, the first portion being substantially perpendicular to the third portion, the second portion being substantially perpendicular to the fourth portion;
    an electrical conductivity characteristic of the member, the electric conductivity being $30 \times 10^6$ $Sm^{-1}$ and greater;

wherein, the first end portion is configured to connect a first electric lead of a first solar cell;

the second end portion is configured to connect a second electric lead of a second solar cell, the second solar cell being disposed at a distance away from the first solar cell, the distance being in a range allowed by separating the slit and a length difference between the third portion and the fourth portion.

2. The device of claim 1 wherein the single shaped thickness of material is one or a combination of materials selected from copper, aluminum, molybdenum, tin, chromium, and iron.

3. The device of claim 2 wherein the single shaped thickness of materials has a thickness ranging from 0.003 inches to 0.2 inches.

4. The device of claim 1 wherein the first length and the second length are the same.

5. The device of claim 1 wherein the first length and the second length are different.

6. The device of claim 1 wherein the first length is adapted for the first end region to couple to a first solar cell and the second length is adapted for the second end region to couple to a second solar cell so that the sheet metal portion is disposed in an open space between the first solar cell and the second solar cell.

7. The device of claim 1 wherein the first end region and the second end region each comprises a structure adapted for coupling to a corresponding solar cell electrical lead.

8. The device of claim 7 wherein the structure comprises a step-like shape having a height between an upper edge and a lower step.

9. The device of claim 8 wherein the height can be adapted for the lower step to be coupled to a front electrode of a solar cell or a back electrode of a neighboring solar cell.

10. The device of claim 8 wherein the lower step comprises a tin plated coating adaptive for soldering.

11. The device of claim 1 wherein the electrical conductivity characteristic of the member allows the single shaped thickness of material to pass an electrical current up to 6 Amp.

12. A method for electrically coupling solar cells for solar module package, the method comprising:

providing a first solar cell, the first solar cell including a first electrical lead;

providing at least a second solar cell disposed next to the first solar cell with an approximate distance, the second solar cell including a second electrical lead;

providing a first electrical coupling device, the first electrical coupling device comprising a conductive member made from a single shaped thickness of material including a first portion with a first end region, a second portion with a second end region, and a sheet metal portion characterized by a thickness, a length, and a width, the sheet metal portion including a slit positioned at substantially a center portion of the sheet metal portion, the slit being characterized being shorter than the length, the sheet metal portion including a third portion and a fourth portion, the third portion being substantially on a same plane as the fourth portion, the third portion having a greater length than the fourth portion, the third portion and the fourth portion being separated by the slit, the third portion being integrally connected to the first portion, the fourth portion being integrally connected to the second portion, the first portion being substantially perpendicular to the third portion, the second portion being substantially perpendicular to the fourth portion;

coupling the first end region to the first electrical lead and the second end region to the second electrical lead while the sheet metal portion is disposed between the first solar cell and the second solar cell;

wherein, the first portion, the second portion, and the slit provides an effective length to accommodate the approximate distance.

13. The method of claim 12 wherein the first electrical lead is disposed near a peripheral location of the first solar cell and the second electrical lead is disposed near a peripheral location of the second solar cell.

14. The method of claim 13 wherein the first end region comprises a step-shaped structure having a first lower step and the second end region comprises a step-shaped structure having a second lower step.

15. The method of claim 14 wherein the coupling the first/second end region to the first/second electrical lead comprises soldering the first/second lower step with the first/second electrical lead to make an electrical connection.

16. The method of claim 14 wherein the coupling the first/second end region to the first/second electrical lead comprises laser welding the first/second lower step with the first/second electrical lead to make an electrical connection.

17. The method of claim 12 wherein the conductive member is characterized by an electrical conductivity of $30 \times 10^6$ $Sm^{-1}$ and greater.

18. The method of claim 12 wherein the approximate distance between two neighboring solar cells may be in a range from 0.005 inches to 0.5 inches.

19. The method of claim 12, further comprising:

providing a third solar cell disposed next to the second solar cell with substantially the same proximate distance, the third solar cell being made substantially the same as the second solar cell;

providing a second electrical coupling device, the second electric coupling device being made substantially the same as the first electrical coupling device; and coupling the third solar cell to the second solar cell using the second electrical coupling device.

20. The method of claim 19, further comprising:

providing a third electrical coupling device, the third electrical coupling device comprising a conductive member characterized by a single step-shaped thickness of material;

coupling the third solar cell to an external connector using the third electrical coupling device.

21. A solar module with inter-coupled solar cells, the solar module comprising:

a first solar cell;

at least a second solar cell disposed near the first solar cell with an approximate separation; and a first coupling device configured to electrically couple the first solar cell to the second solar cell;

wherein, the first coupling device includes a conductive member characterized by a single shaped thickness of material with an electrical conductivity being $30 \times 10^6$ $Sm^{-1}$ and greater, the member comprising:

a first portion extending a first length from a first end region;

a second portion extending a second length from a second end region;

a sheet metal characterized by a thickness, a length, and a width, the sheet metal including a slit positioned at substantially a center portion of the sheet metal, the slit being characterized being shorter than the length, the sheet metal including a third portion and a fourth portion, the third portion being substantially on a same plane as the fourth portion, the third portion having a greater length than the fourth portion, the third portion and the fourth portion being separated by the slit, the third portion being integrally connected to the first portion, the fourth portion being integrally connected to the second portion, the first portion being substantially perpendicular to the third portion, the second portion being substantially perpendicular to the fourth portion;

the first end region is configured to connect a first electric lead of the first solar cell;

the second end region is configured to connect a second electric lead of the second solar cell with the approximate separation being in a range allowed by separating the slit and a length difference between the third portion and the fourth portion.

22. The solar module of claim 21 wherein the first solar cell and the second solar cell each comprises a packaged light concentrator over a plurality of photovoltaic strips connected by one or more conductive members.

23. The solar module of claim 22 wherein the one or more conductive members are metal bus bars each with at least one electric leads extended to an edge of the solar cell.

24. The solar module of claim 22 wherein at least one conductive member connects to a front sides of a plurality of photovoltaic strips on the first solar cell and at least another conductive member connects a back sides of a plurality of photovoltaic strips on the second solar cell.

25. The solar module of claim 21 wherein the approximate separation is about a range from 0.005 inches to 0.2 inches.

26. The solar module of claim 21 wherein the first portion extending a first length from a first end region comprises a first width.

27. The solar module of claim 21 wherein the first length is about 0.5 inches.

28. The solar module of claim 26 wherein the first width ranges from 0.05 inches to 0.5 inches.

29. The solar module of claim 21 wherein the first end region comprises a step-shaped structure with a lower step being configured to couple to an electrical lead on the first solar cell.

30. The solar module of claim 29 wherein the electrical lead on the first solar cell is a front side electrode of photovoltaic junction.

31. The solar module of claim 29 wherein the electrical lead on the first solar cell is a back side electrode of photovoltaic junction.

32. The solar module of claim 21 wherein the second portion extending a second length from a second end region comprises a second width.

33. The solar module of claim 32 wherein the second length is different from the first length.

34. The solar module of claim 26 wherein the second width is different from the first width.

35. The solar module of claim 32 wherein the second end region comprises a step-shaped structure with a lower step being configured to couple to an electrical lead on the second solar cell.

36. The solar module of claim 35 wherein the electrical lead on the second solar cell is a front side electrode of photovoltaic junction.

37. The solar module of claim 35 wherein the electrical lead on the second solar cell is a back side electrode of photovoltaic junction.

38. The solar module of claim 21, further comprising:
a third solar cell, the third solar cell being made substantially the same as the second solar cell;
a second coupling device electrically coupled to the third solar cell and the second solar cell, the second coupling device being made substantially the same as the first coupling device.

39. The solar module of claim 38, further comprising:
a third coupling device electrically coupled to the third solar cell and an external connector;
wherein the third coupling device comprises a conductive member characterized by a single shaped thickness of material.

* * * * *